(12) United States Patent
Matsumoto et al.

(10) Patent No.: US 10,256,070 B2
(45) Date of Patent: Apr. 9, 2019

(54) STAGE MECHANISM

(71) Applicant: NuFlare Technology, Inc., Yokohama-shi (JP)

(72) Inventors: Hiroshi Matsumoto, Yokohama (JP); Shuji Yoshino, Kunitachi (JP)

(73) Assignee: NuFlare Technology, Inc., Yokohama-shi (JP)

(*) Notice: Subject to any disclaimer, the term of this patent is extended or adjusted under 35 U.S.C. 154(b) by 14 days.

(21) Appl. No.: 15/581,859

(22) Filed: Apr. 28, 2017

(65) Prior Publication Data
US 2017/0316914 A1 Nov. 2, 2017

(30) Foreign Application Priority Data

Apr. 28, 2016 (JP) .................................. 2016-090748

(51) Int. Cl.
*H01J 37/20* (2006.01)
*H01J 37/317* (2006.01)
*H01J 37/04* (2006.01)

(52) U.S. Cl.
CPC ............ *H01J 37/20* (2013.01); *H01J 37/045* (2013.01); *H01J 37/3174* (2013.01); *H01J 37/3177* (2013.01); *H01J 2237/002* (2013.01); *H01J 2237/024* (2013.01); *H01J 2237/0437* (2013.01)

(58) Field of Classification Search
CPC ...... H01J 37/20; H01J 37/045; H01J 37/3174; H01J 37/3177; H01J 2237/0437; H01J 2237/024; H01J 2237/002
USPC ................................ 250/453.11, 492.1–492.3
See application file for complete search history.

(56) References Cited

U.S. PATENT DOCUMENTS

| | | | | |
|---|---|---|---|---|
| 6,863,736 B2* | 3/2005 | Leavitt | ................... | C23C 14/505 118/500 |
| 7,601,974 B2* | 10/2009 | Mito | ....................... | H01J 37/20 250/492.1 |
| 8,558,196 B2* | 10/2013 | Wieland | ................. | B82Y 10/00 250/396 R |
| 8,586,949 B2* | 11/2013 | Dinu-Gurtler | ......... | B82Y 10/00 250/396 R |
| 2007/0182942 A1* | 8/2007 | Kasono | ................... | B82Y 10/00 355/53 |
| 2012/0288800 A1* | 11/2012 | Ito | ........................... | H01J 3/028 430/296 |
| 2016/0211111 A1* | 7/2016 | Iizuka | ................. | H01J 37/3045 |
| 2017/0169993 A1* | 6/2017 | Iizuka | ................. | H01J 37/3177 |

FOREIGN PATENT DOCUMENTS

JP 2015-109323 6/2015

* cited by examiner

*Primary Examiner* — Michael Maskell
(74) *Attorney, Agent, or Firm* — Oblon, McClelland, Maier & Neustadt, L.L.P.

(57) ABSTRACT

According to one aspect of the present invention, a stage mechanism includes a movable stage disposed in a vacuum atmosphere and mounting a heat source, a first heat pipe connected to the heat source, a movable mechanism configured to move according to the movement of the first heat pipe caused by the movement of the stage, by using a portion of the first heat pipe, and a cooling mechanism configured to cool the first heat pipe through the movable mechanism.

9 Claims, 14 Drawing Sheets

STAGE MECHANISM

CROSS-REFERENCE TO RELATED APPLICATION

This application is based upon and claims the benefit of priority from prior Japanese Patent Application No. 2016-090748 filed on Apr. 28, 2016 in Japan, the entire contents of which are incorporated herein by reference.

BACKGROUND OF THE INVENTION

Field of the Invention

The present invention relates to a stage mechanism, and more particularly, to a stage mechanism on which a blanking aperture array mechanism for performing the blanking control of multiple beams of multiple-beam writing is placed.

Related Art

A lithography technique, which is responsible for the progress of the miniaturization of semiconductor devices, is a very important process for forming unique patterns among processes for manufacturing semiconductors. In recent years, the width of a line of a circuit, which is required for semiconductor devices, has been reduced every year with high integration of LSI. Here, since an electron beam writing (or "drawing") technique has excellent resolution in essence, an electron beam is used for mask blanks to draw mask patterns.

For example, there is a lithography apparatus using multiple beams. When multiple beams are used, many beams can be applied at a time in comparison with a case in which one electron beam is used to write patterns. As a result, throughput can be significantly improved. In a lithography apparatus using such a multiple-beam method, an electron beam emitted from an electron gun assembly passes through a mask having a plurality of holes, so that multiple beams are formed. Then, each of the multiple beams is subjected to blanking control; each of the beams, which are not blocked, is reduced by an optical system; mask images are reduced in size; the beams are deflected by deflectors; and a target object (or "sample") is irradiated at a desired position with the beams.

Here, in the multiple-beam writing, the doses of the respective beams are individually controlled depending on beam irradiation time. It is necessary to perform blanking control, which turns on/off a beam, at a high speed to control the dose of each beam with high accuracy. The lithography apparatus using such a multiple-beam method is provided with a blanking aperture array mechanism on which the respective blankers for multiple beams are disposed.

Here, individual control circuits for individually performing the blanking control of the respective beams and circuits for individually transmitting control signals to the respective control circuits are built in a blanking aperture array mechanism (for example, Published Unexamined Japanese Patent Application No. 2015-109323). For this reason, since the control circuits and the like generate heat due to a blanking operation at the time of writing processing, the blanking aperture array mechanism serves as a heat source. Further, since the positions of the multiple beams need to be aligned with the positions of a plurality of passage holes which are formed in the blanking aperture array mechanism and through which multiple beams pass, the blanking aperture array mechanism is disposed on a stage that can be aligned, for example, in a rotation direction. Meanwhile, since multiple beams, which are formed from an electron beam, need to pass through the blanking aperture array mechanism, the blanking aperture array mechanism needs to be disposed in vacuum. In such a state, heat generated in the blanking aperture array mechanism needs to be exhausted. However, it is difficult to radiate heat to the vacuum from the blanking aperture array mechanism itself. For this reason, there is a problem that a cooling device having low thermal resistance and movability is required.

BRIEF SUMMARY OF THE INVENTION

According to one aspect of the present invention, a stage mechanism includes a movable stage disposed in a vacuum atmosphere and mounting a heat source, a first heat pipe connected to the heat source, a movable mechanism configured to move according to the movement of the first heat pipe caused by the movement of the stage, by using a portion of the first heat pipe, and a cooling mechanism configured to cool the first heat pipe through the movable mechanism.

DETAILED DESCRIPTION OF THE INVENTION

In embodiments, a stage mechanism on which a heat source disposed in vacuum is movably placed and which can exhaust heat generated from the heat source and has both low thermal resistance and movability will be described.

Further, a structure using an electron beam as an example of a charged particle beam will be described below in the embodiments. However, a charged particle beam is not limited to an electron beam, and may be a beam using charged particles, such as an ion beam.

First Embodiment

Figure 1:
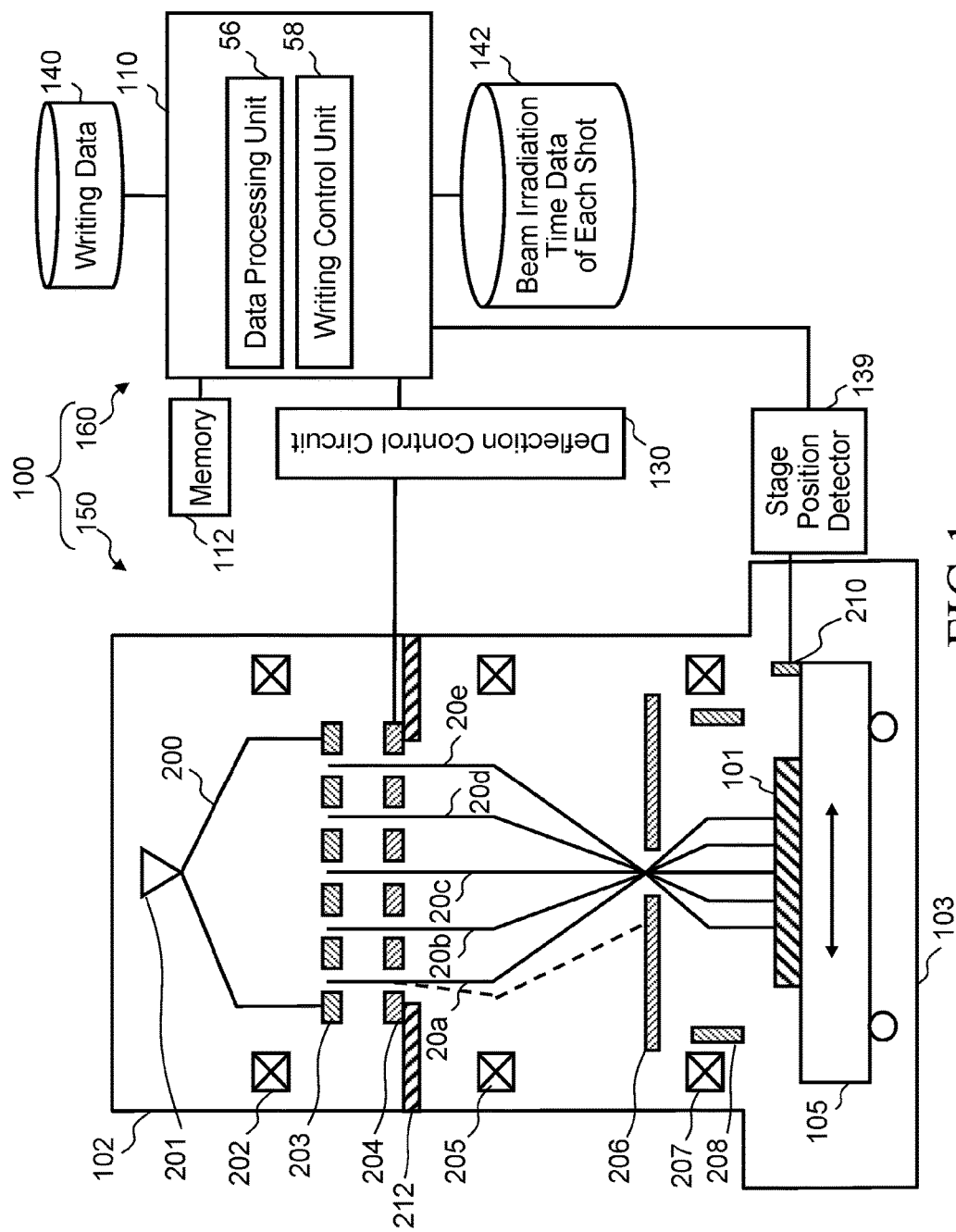
FIG. 1 is a conceptual diagram illustrating the structure of a lithography apparatus of a first embodiment.

FIG. 1 is a conceptual diagram illustrating the structure of a lithography apparatus of a first embodiment. In FIG. 1, the lithography apparatus 100 (writing apparatus) includes a writing mechanism 150 and a control unit 160. The lithography apparatus 100 is an example of a multiple-charged particle beam lithography apparatus. The writing mechanism 150 includes an electron optical column 102 and a writing chamber 103. An electron gun assembly 201, an illumination lens 202, a shaping aperture array substrate 203, a blanking aperture array mechanism 204, a reducing lens 205, a limiting aperture substrate 206, an objective lens 207, and a deflector 208 are disposed in the electron optical column 102. An X-Y stage 105 is disposed in the writing chamber 103. A target object 101, such as mask blanks, which serves as a writing target substrate at the time of writing (or "drawing"), is disposed on the X-Y stage 105. The target object 101 includes a mask for exposure that is used to manufacture semiconductor devices, a semiconductor substrate (silicon wafer) from which semiconductor devices are manufactured, or the like. A mirror 210, which is used to measure the position of the X-Y stage 105, is further disposed on the X-Y stage 105.

Further, the electron optical column 102 is disposed so that a blanking aperture stage mechanism 212 is put in the electron optical column 102. The blanking aperture array mechanism 204 is placed on the blanking aperture stage mechanism 212. Furthermore, a shaping aperture stage (not illustrated) is disposed on the blanking aperture stage mechanism 212, and the shaping aperture array substrate 203 is placed on the shaping aperture stage.

The control unit 160 includes a control calculator 110, a memory 112, a deflection control circuit 130, a stage position detector 139, and data storage devices 140 and 142, such as magnetic disk devices. The control calculator 110, the memory 112, the deflection control circuit 130, the stage position detector 139, and the data storage devices 140 and 142 are connected to each other through a bus (not illustrated). Writing data are input to the data storage device 140 (data storage unit) from the outside, and are stored in the data storage device 140.

A data processing unit 56 and a writing control unit 58 are disposed in the control calculator 110. The respective "~ units", such as the data processing unit 56 and the writing control unit 58, include processing circuitry, and the processing circuitry includes an electrical circuit, a computer, a processor, a circuit substrate, a quantum circuit, a semiconductor device, or the like. Further, the respective "~ units" may use common processing circuitry (the same processing circuitry). Alternatively, the respective "~ units" may use different processing circuitry (separate processing circuitry). Information, which is input to and output from the data processing unit 56 and the writing control unit 58, and information, which is being calculated, are stored in the memory 112 each time.

Here, in FIG. 1, the first embodiment is described and a necessary structure is illustrated. The lithography apparatus 100 may usually include other necessary structures.

Figure 2A:
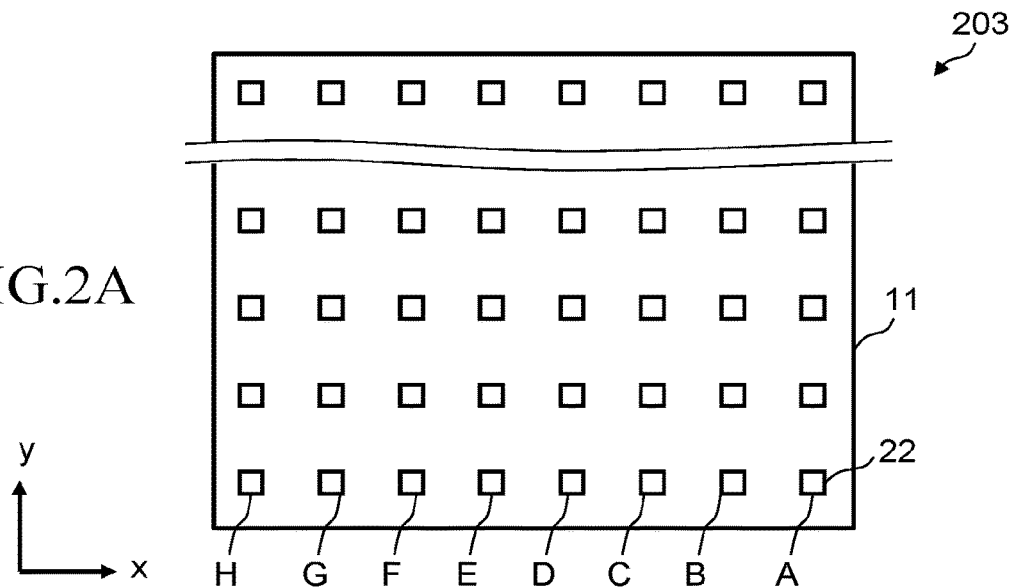
FIGS. 2A and 2B are conceptual diagrams illustrating the structure of a shaping aperture array substrate of the first embodiment.
Figure 2B:
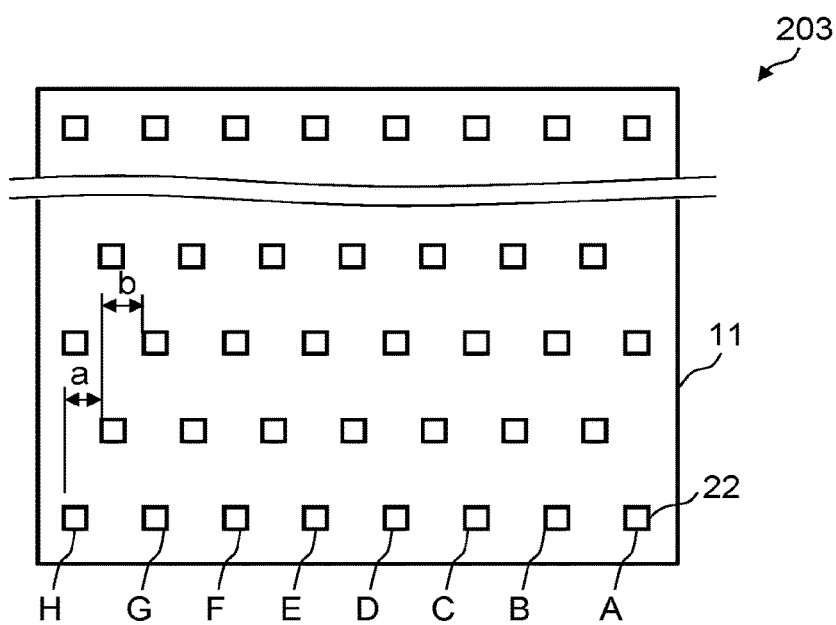

FIGS. 2A and 2B are conceptual diagrams illustrating the structure of the shaping aperture array substrate of the first embodiment. In FIG. 2A, holes (openings) 22, which are arranged so as to have m rows in a length direction (a y direction) and n columns in a width direction (an x direction) (m, n≥2), are formed in a rectangular region 11 of the shaping aperture array substrate 203 at predetermined arrangement pitches in the shape of a matrix. For example, holes 22, which have 512 rows and 8 columns, are formed in FIG. 2A. The respective holes 22 are formed in a rectangular shape having the same dimensions. Alternatively, the respective holes 22 may be formed in a circular shape having the same outer diameter. An example in which eight holes 22 arranged from A to H in the x direction are formed in each of the rows arranged in the y direction is illustrated here. Apart of an electron beam 200 passes through the plurality of holes 22, so that multiple beams 20 are formed. Here, an example in which two or more rows including the holes 22 are arranged in the length direction (the y direction) and two or more columns including the holes 22 are arranged in the width direction (the x direction), but the invention is not limited thereto. For example, a plurality of lines may be arranged in any one direction of the x direction and the y direction (the width direction and the length direction) and only one line may be arranged in the other direction. Further, a method of arranging the holes 22 is not limited to a case in which the holes 22 are arranged in the shape of a lattice in the length direction and the width direction as illustrated in FIG. 2A. For example, the holes of the first and second columns extending in the length direction (the y direction) may be disposed so as to be shifted by a distance "a" in the width direction (the x direction) as illustrated in FIG. 2B. Likewise, the holes of the second and third rows extending in the length direction (the y direction) may be disposed so as to be shifted by a distance "b" in the width direction (the x direction).

Figure 3:
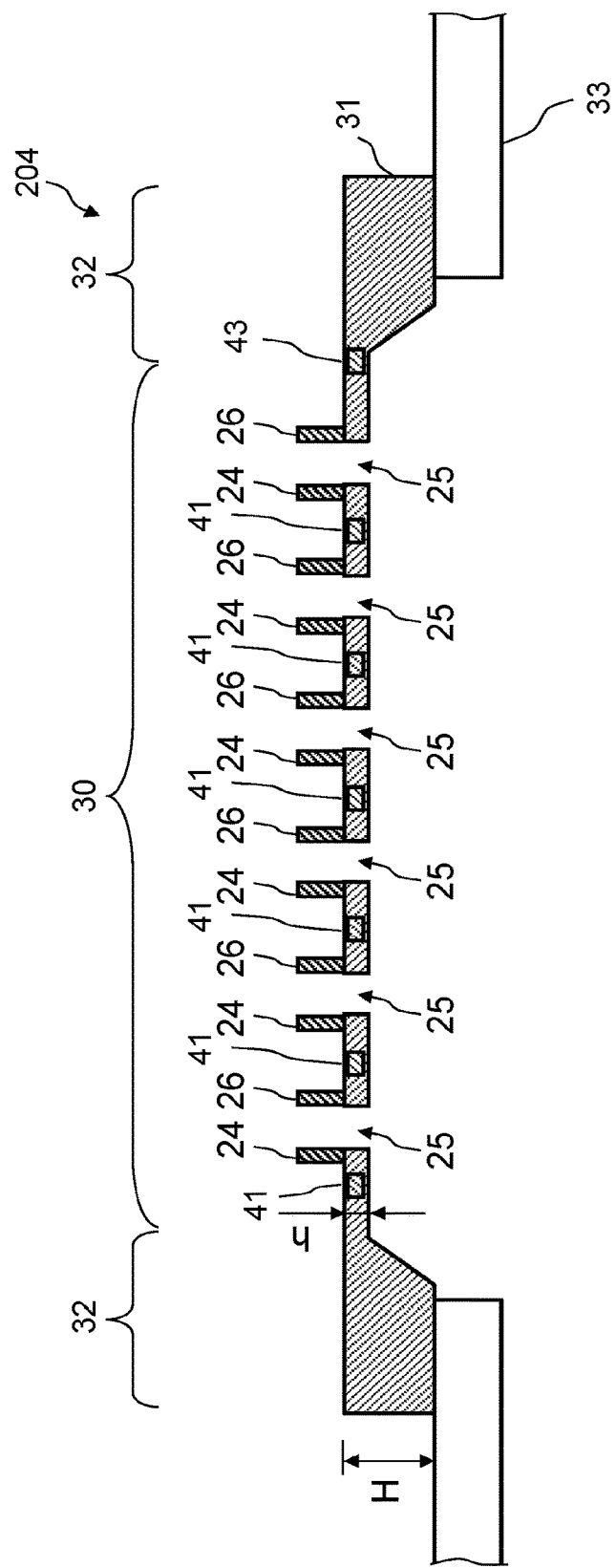
FIG. 3 is a cross-sectional view illustrating the structure of a blanking aperture array mechanism of the first embodiment.

FIG. 3 is a cross-sectional view illustrating the structure of the blanking aperture array mechanism of the first embodiment.

Figure 4:
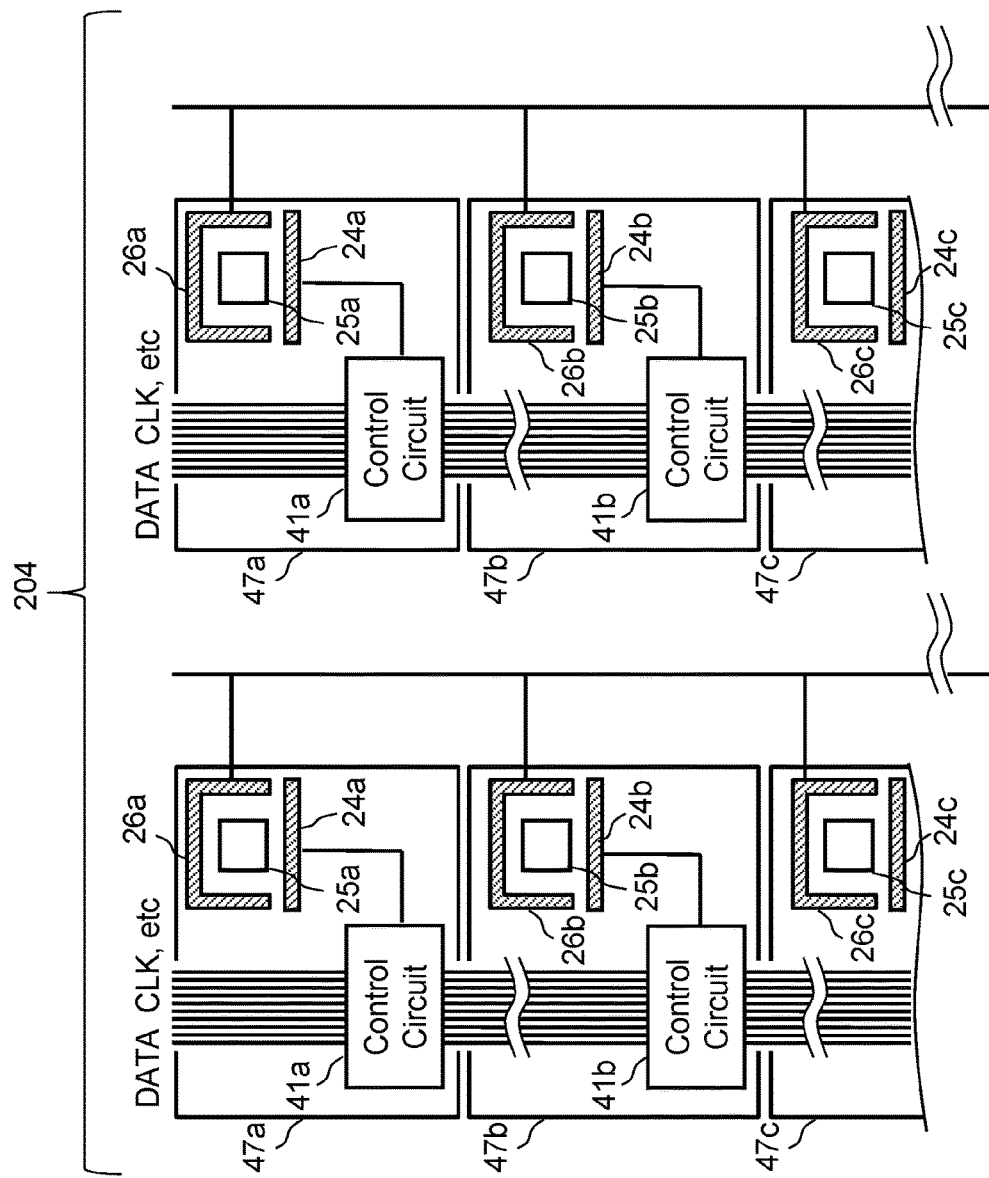
FIG. 4 is a top conceptual diagram illustrating a part of the structure of the blanking aperture array mechanism of the first embodiment in a membrane region.

FIG. 4 is a top conceptual diagram illustrating a part of the structure of the blanking aperture array mechanism of the first embodiment in a membrane region. Meanwhile, positional relationships of switching electrodes 24, counter electrodes 26, and a control circuit 41 are not illustrated so as to correspond to each other in FIGS. 3 and 4. As illustrated in FIG. 3, a semiconductor substrate 31 made of silicon or the like is disposed on a support substrate 33 in the blanking aperture array mechanism 204. For example, the central portion of the substrate 31 is cut from the back side so as to be thin, and is machined as a membrane region 30 (a first region) having a small thickness h. A peripheral portion, which surrounds the membrane region 30, forms an outer peripheral region 32 (a second region) having a large thickness H. The upper surface of the membrane region 30 and the upper surface of the outer peripheral region 32 are formed so as to be disposed at the same height position or substantially the same height position. The back surface of the outer peripheral region 32 of the substrate 31 is held on the support substrate 33. The central portion of the support substrate 33 is opened, and the position of the membrane region 30 is present in the opened region of the support substrate 33.

Passage holes 25 (openings) through which the respective beams of the multiple beams pass are opened in the membrane region 30 at positions corresponding to the respective holes 22 of the shaping aperture array substrate 203 illustrated in FIG. 2A (or FIG. 2B). In other words, the plurality of passage holes 25, which are arranged in an array and through which multiple beams using an electron beam pass, are formed in the substrate 31. Further, sets (blankers; blanking deflectors) of the counter electrodes 26 (26a, 26b, and 26c) and the switching electrodes 24 (24a, 24b, and 24c) for blanking deflection are disposed on the membrane region 30 at positions near the respective passage holes 25 so that each passage hole 25 is interposed between the switching electrode and the counter electrode as illustrated in FIGS. 3 and 4. Furthermore, a control circuit 41 (a logic circuit), which switchably applies deflection voltages having two values (a positive potential Vdd and a ground (GND) potential) to the switching electrode 24 for each passage hole 25, is disposed near each passage hole 25 in the membrane region 30 in a thickness direction. A ground (GND) potential is applied to the counter electrode 26 for each beam. Moreover, a plurality of pads 43, which transmit control signals including beam irradiation time data to the plurality of control circuits 41, are disposed around the plurality of passage holes 25 formed in the substrate 31.

A case in which the number of the switching electrodes 24 and the number of the counter electrodes 26 are equal to each other is illustrated in the example illustrated in FIGS. 3 and 4, but the invention is not limited thereto. A common counter electrode 26 may be disposed for each of, for example, the same row or column of the plurality of switching electrodes 24 that are arranged in an array. Accordingly, a ratio of the number of the plurality of switching electrodes 24 to the number of the plurality of counter electrodes 26 may be 1 or more.

Further, as illustrated in FIG. 4, n-bit (for example, 10 bit) parallel lines for control signals are connected to each of the control circuits 41. A clock signal line and a power-supply line are connected to each of the control circuits 41 in addition to the n-bit parallel lines for control. Some lines of the parallel lines may be used as the clock signal line and the power-supply line. An individual blanking mechanism 47, which includes the switching electrode 24, the counter electrode 26, and the control circuit 41, is provided for each of the beams forming the multiple beams. Further, in the example of FIG. 3, the switching electrodes 24, the counter electrodes 26, and the control circuits 41 are disposed in the thin membrane region 30 of the substrate 31.

Each electron beam of the multiple beams 200, which passes through the each passage hole 25, is deflected due to a difference between the potentials that are independently applied to the two electrodes 24 and 26 making a pair. Blanking control is performed by the deflection of the electron beam. In other words, a set of the switching electrode 24 and the counter electrode 26 performs the blanking deflection of a corresponding beam among the multiple beams having passed through the plurality of holes 22 (openings) of the shaping aperture array substrate 203.

Figure 5:
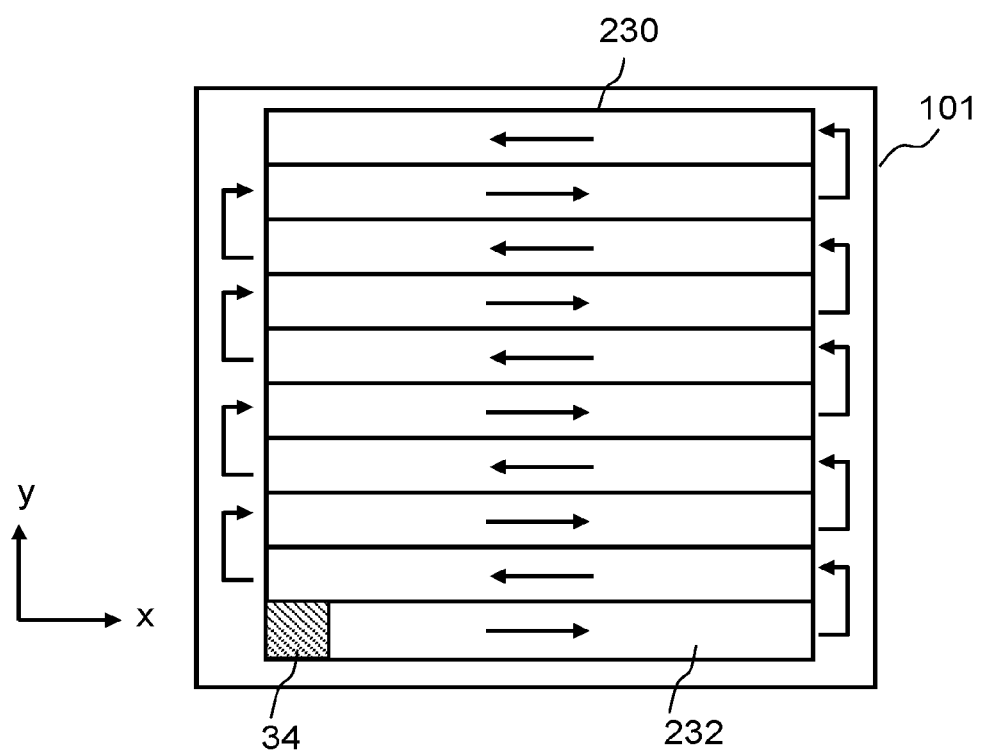
FIG. 5 is a conceptual diagram illustrating an example of a writing operation of the first embodiment.

FIG. 5 is a conceptual diagram illustrating an example of a writing operation of the first embodiment. As illustrated in FIG. 5, a writing region 230 of the target object 101 is virtually divided into, for example, a plurality of stripe regions 232 having the shape of a strip having a predetermined width in the y direction. Each of the stripe regions 232 forms a writing unit region. First, the X-Y stage 105 is moved and is adjusted so that an irradiation region 34, which can be irradiated with multiple beams 20 at a time, is positioned at the left end of the first stripe region 232 or a position on the left side of the left end of the first stripe region 232; and writing is then started. When writing is performed in the first stripe region 232, the X-Y stage 105 is moved, for example, in a −x direction so that writing is performed relatively in the x direction. For example, the X-Y stage 105 is continuously moved at a predetermined speed. After the end of the writing of the first stripe region 232, the position of the stage is moved in a −y direction and is adjusted so that the irradiation region 34 is relatively moved in the y direction and positioned at the right end of the second stripe region 232 or a position on the right side of the right end of the second stripe region 232. Then, the X-Y stage 105 is moved, for example, in the x direction at this time so that writing is performed relatively in the −x direction in the same manner. Since writing is performed while the direction of the writing is alternately changed so that writing is performed in the x direction in the third stripe region 232 and writing is performed in the −x direction in the fourth stripe region 232, writing time can be shortened. However, the invention is not limited to a case in which writing is performed while the direction of the writing is alternately changed, and writing may be performed in the same direction when writing is performed in each stripe region 232. In one shot, a plurality of shot patterns of which the number is the same as the number of the respective holes 22 are formed at a time by multiple beams that are formed when an electron beam passes through the respective holes 22 of the shaping aperture array substrate 203.

Writing processing is performed as described below. Specifically, the data processing unit 56 reads writing data from the data storage device 140, and calculates the area density of a pattern that is disposed in each of a plurality of mesh regions virtually divided in the shape of a mesh from the writing region of the target object 101 or a chip region in which writing is to be performed. For example, first, the writing region of the target object 101 or the chip region in which writing is to be performed is divided into stripe regions having the shape of a strip having a predetermined width. Then, each of the stripe regions is virtually divided into the above-mentioned plurality of mesh regions. For example, it is suitable that the size of the mesh region is equal to or smaller than the size of a beam. For example, it is suitable that the size of the mesh region is set to a size of about 10 nm. For example, the data processing unit 56 reads corresponding writing data from the data storage device 140 every stripe region, and assigns a plurality of figures, which are defined in the writing data, to the mesh regions. Then, the data processing unit 56 may calculate the area density of the figure disposed in each of the mesh regions.

Further, the data processing unit 56 calculates beam irradiation time T of an electron beam per shot (referred to as shot time or exposure time. The same applies to the following description) every mesh region having a predetermined size. In a case in which multiple writing is performed, the data processing unit 56 may calculate beam irradiation time T of an electron beam per shot in each hierarchy. It is suitable that beam irradiation time T as a reference is obtained in proportion to the area density of a pattern to be calculated. Furthermore, it is suitable that beam irradiation time T to be finally calculated is set to time corresponding to a corrected dose that is obtained when a dimensional variation, which corresponds to a phenomenon causing a dimensional variation, such as a proximity effect, a fogging effect, or a loading effect (not illustrated), is corrected by a dose. A plurality of mesh regions defining the beam irradiation time T and a plurality of mesh regions defining the area density of a pattern may have the same size and may have different sizes. In a case in which a plurality of mesh regions defining the beam irradiation time T and a plurality of mesh regions defining the area density of a pattern have different sizes, each beam irradiation time T may be obtained after the area density is interpolated by linear interpolation or the like. The beam irradiation time T of each mesh region is defined in a beam irradiation time map, and the beam irradiation time map is stored in, for example, the data storage device 142.

Further, the data processing unit 56 converts the data of the beam irradiation time of a corresponding beam into n-bit data, and creates beam irradiation time sequence data. The created beam irradiation time sequence data are output to the deflection control circuit 130.

The deflection control circuit 130 outputs beam irradiation time sequence data to each control circuit 41 in each shot.

Then, in a writing step, the writing mechanism 150 performs the writing of corresponding beam irradiation time in each shot of a beam under the control of the writing control unit 58. Specifically, the writing mechanism 150 operates as described below.

The electron beam 200 emitted from the electron gun assembly 201 (an emission unit) illuminates the entire shaping aperture array substrate 203 by the illumination lens 202 so as to be substantially perpendicular to the shaping aperture array substrate 203. A plurality of rectangular holes 22 (opening) are formed in the shaping aperture array substrate 203, and the region of the shaping aperture array substrate 203 including all the plurality of holes 22 is illuminated with the electron beam 200. A part of the electron beam 200, which is applied to the positions of the plurality of holes 22, passes through the plurality of holes 22 of the shaping aperture array substrate 203, so that a plurality of electron beams (multiple beams) 20a to 20e having, for example, a rectangular shape are formed. The multiple beams 20a to 20e pass through corresponding blankers (first deflectors: individual blanking mechanisms) of the blanking aperture array mechanism 204. The blankers individually deflect the electron beams 20 passing therethrough (The blankers performs blanking deflection).

The multiple beams 20a to 20e, which have passed through the blanking aperture array mechanism 204, are reduced by the reducing lens 205 and travel toward a center hole formed in the limiting aperture substrate 206. Here, since the positions of the electron beams 20, which are deflected by the blankers of the blanking aperture array mechanism 204, are shifted from the center hole of the limiting aperture substrate 206, the electron beams 20 are blocked by the limiting aperture substrate 206. On the other hand, the electron beams 20, which are deflected by the blankers of the blanking aperture array mechanism 204, pass through the center hole of the limiting aperture substrate 206 as illustrated in FIG. 1. Blanking control is performed by the ON/OFF of the individual blanking mechanisms 47, so that the ON/OFF of the beams are controlled. In this way, the limiting aperture substrate 206 blocks each beam that is deflected so as to be in a beam-OFF state by the individual blanking mechanism 47. Then, beams of one shot are formed of beams that are formed until beams are turned off after the beams are turned on and then have passed through the limiting aperture substrate 206. The multiple beams 20, which have passed through the limiting aperture substrate 206, are focused by the objective lens 207, and form a pattern image having a desired reduction ratio, and the respective beams (all the multiple beams 20) having passed through the limiting aperture substrate 206 are collectively deflected in the same direction by the deflector 208 and are applied to irradiation positions of the respective beams on the target object 101. Further, for example, when the X-Y stage 105 is continuously moved, the irradiation positions of the beams are controlled by the deflector 208 so as to follow the movement of the X-Y stage 105. A laser is applied to the mirror 210 disposed on the X-Y stage 105 from the stage position detector 139, and the position of the X-Y stage 105 is measured using the reflected light of the laser. The multiple beams 20, which are applied at a time, are arranged ideally at a pitch that is obtained by multiplying the arrangement pitch of the plurality of holes 22 of the shaping aperture array substrate 203 by the above-mentioned desired reduction ratio. The lithography apparatus 100 performs a writing operation in a manner in which a plurality of shot beams, which correspond to ON-beams and are to be applied at a time, are continuously and sequentially applied. When a desired pattern is drawn, beams required according to the pattern are controlled to be turned on by blanking control.

Figure 6:
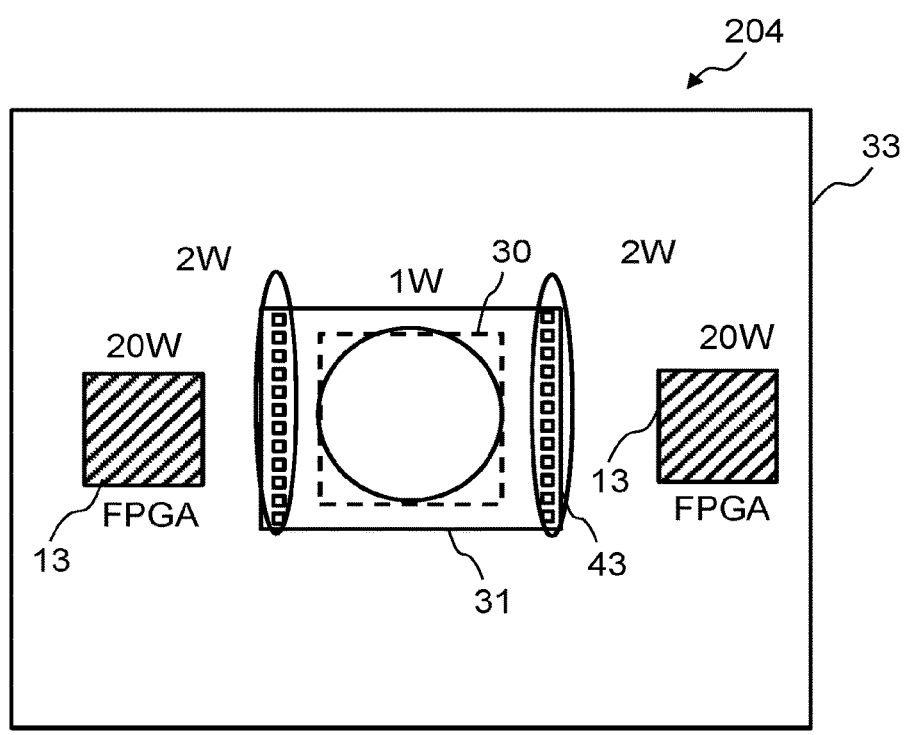
FIG. 6 is a diagram illustrating an example of the amount of generated heat of the blanking aperture array mechanism of the first embodiment.

FIG. 6 is a diagram illustrating an example of the amount of generated heat of the blanking aperture array mechanism of the first embodiment. A plurality of transmission circuits 13, which transmit control signals to the plurality of pads 43 disposed on the substrate 31, are disposed on the support substrate 33 of the blanking aperture array mechanism 204. For example, it is suitable that FPGA (Field Programmable Gate Array) is used as the transmission circuit 13. The transmission circuit performs the transmission of high-speed signals, which are supplied from the outside of the support substrate 33, to a buffer and the substrate 31; the checking of data errors; a request to transmit data and processing for receiving data again; and the like. In an example of FIG. 6, for example, two transmission circuits 13 are disposed with the substrate 31 interposed therebetween. It is suitable that the plurality of transmission circuits 13 are disposed on the back side of the support substrate 33 (mounting substrate). Here, in the blanking aperture array mechanism 204, heat is generated from the membrane region 30 including the plurality of control circuits 41, a plurality of pads 43, and the plurality of transmission circuits 13. Heat of, for example, 1 W is generated from the membrane region 30. Heat of, for example, 2 W is generated on each of both sides of the substrate 31 from the plurality of pads 43, that is, heat of, for example, 4 W is generated in total. Heat of, for example, 20 W is generated on each of both sides of the substrate 31 from the plurality of transmission circuits 13, that is, heat of, for example, 40 W is generated in total. As a result, heat of, for example, 45 W is generated in the entire blanking aperture array mechanism 204. Accordingly, the blanking aperture array mechanism 204 itself serves as a heat source. For the suppression of a temperature rise within, for example, 40K with the generated heat of, for example, 45 W, thermal resistance between the heat source and a cooling part needs to be set to be lower than 0.9 K/W.

Figure 7:
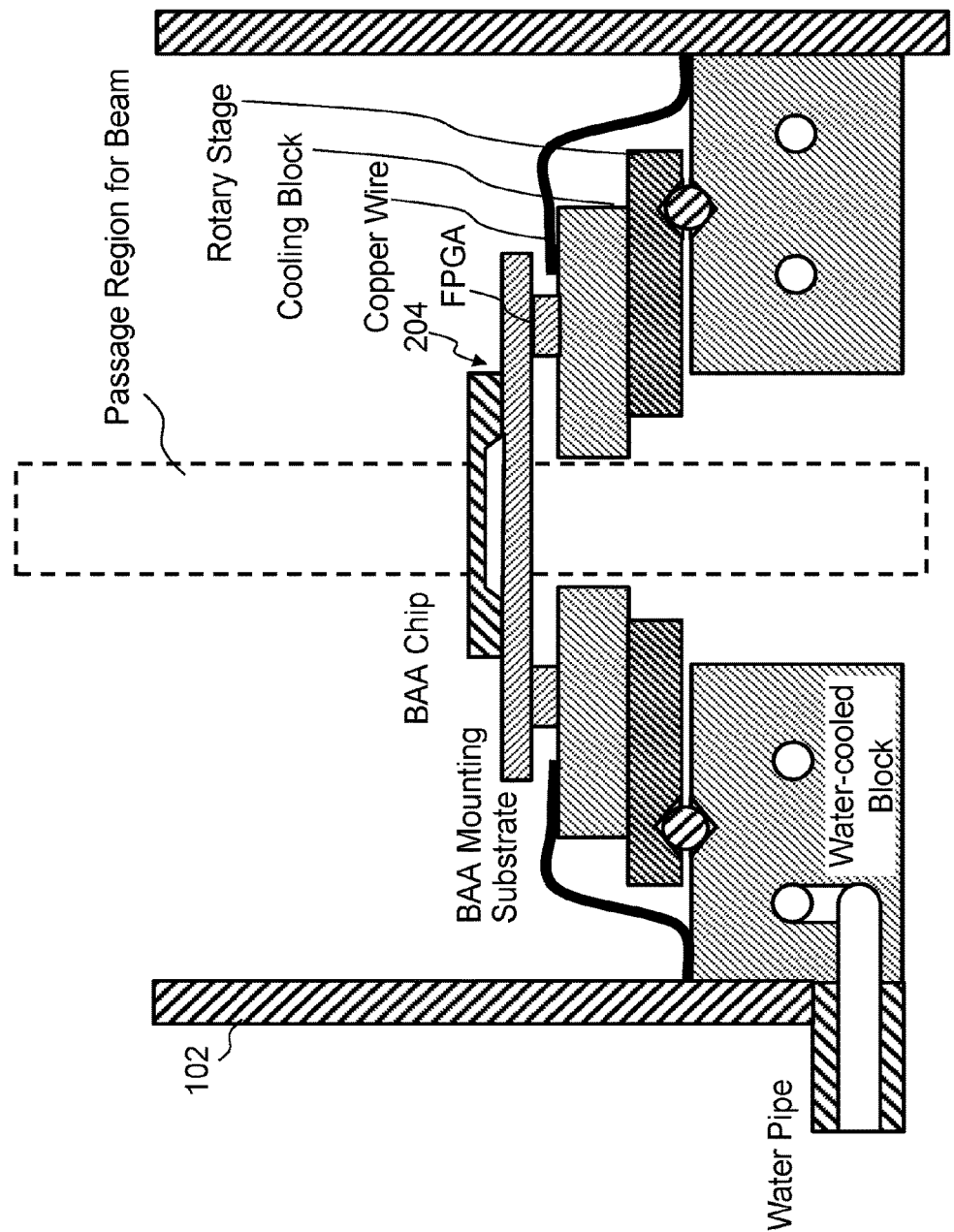
FIG. 7 is a cross-sectional view illustrating an example of a blanking aperture stage mechanism of a comparative example of the first embodiment.

FIG. 7 is a cross-sectional view illustrating an example of a blanking aperture stage mechanism of a comparative example of the first embodiment. As described above, the blanking aperture array mechanism 204 needs to be disposed so as to be rotatable along a plane (two dimensions of the x direction and the y direction) orthogonal to an optical axis (z direction). For this reason, in a blanking aperture stage mechanism of a comparative example, a rotary stage is disposed on a water-cooled block and a blanking aperture array mechanism 204 is placed on the rotary stage with a cooling block interposed therebetween. The rotary stage is disposed on the water-cooled block with a ball bearing or the like interposed therebetween so as to be made rotatable. Since vacuum atmosphere is maintained in the electron optical column 102, it is difficult to radiate heat generated in the blanking aperture array mechanism 204 to the vacuum atmosphere. Accordingly, the amount of heat generated in the blanking aperture array mechanism 204 is transferred (radiated) to the cooling block. However, since the rotary stage and the water-cooled block are not in contact with any member other than the ball bearing or the like, the amount of heat to be transferred to the water-cooled block is reduced. Accordingly, the comparative example is adapted so that the cooling block and the water-cooled block are connected to each other by a copper wire as a low thermal resistance material.

Here, the coefficient of heat conduction of copper (Cu) is 398 W/(K·m). Accordingly, in order to make thermal resistance be lower than, for example, 0.9 K/W, only thermal resistance equivalent to a copper wire of which the length is shorter than 4 cm is allowed in a case in which the cross-sectional area of the copper wire is set to 1 cm$^2$ (a diameter of about 3 mm). When the cooling block and the water-cooled block are connected to each other by the copper wire as in the comparative example of FIG. 7, the copper wire needs to be thinner considering the movability of the rotary stage. However, since thermal resistance is increased when the copper wire is made thin, it is difficult to sufficiently exhaust (transfer) heat. Accordingly, in the first embodiment, a heat pipe having a sufficient diameter is used and movably exhausts heat.

Figure 8:
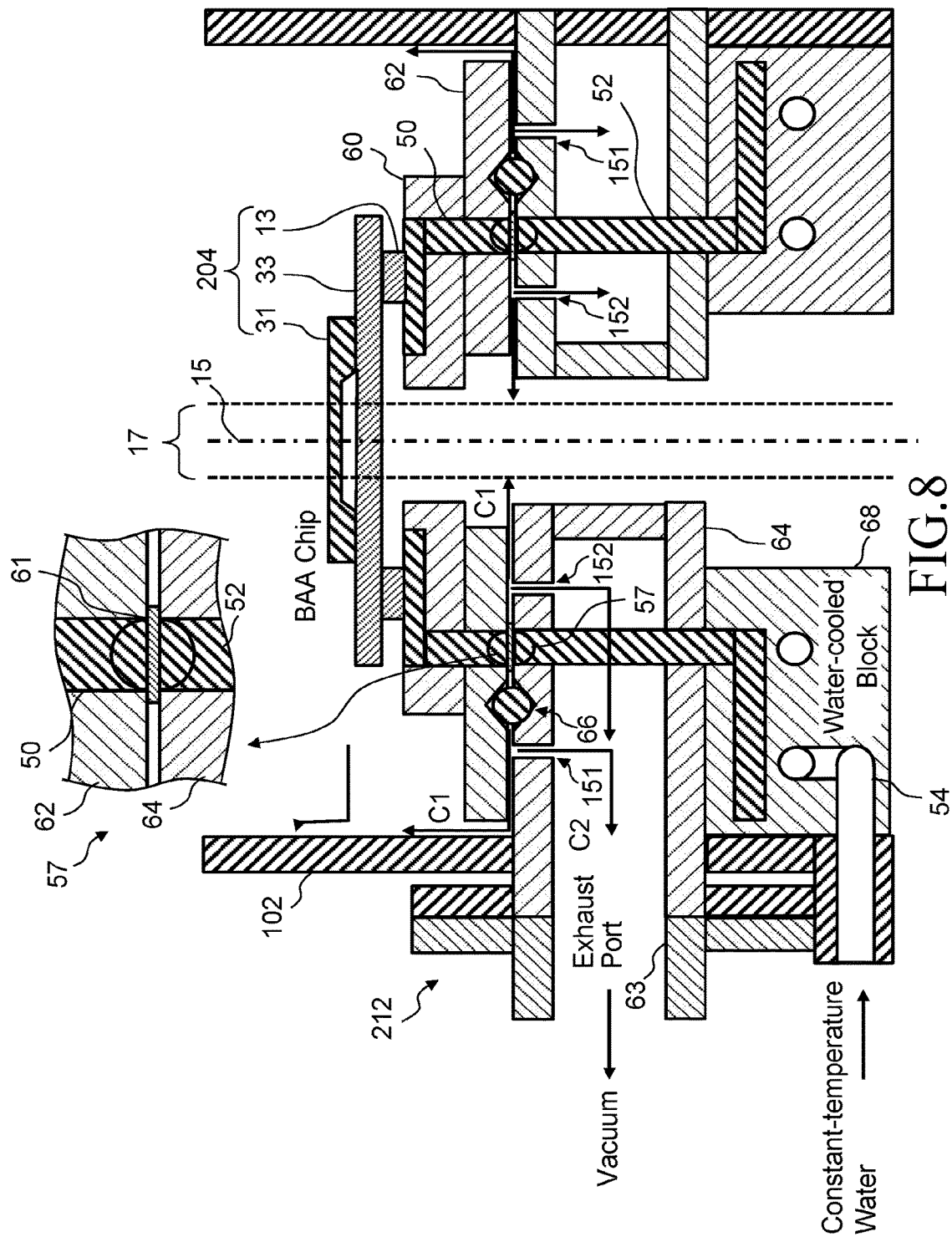
FIG. 8 is a cross-sectional view illustrating an example of a blanking aperture stage mechanism of the first embodiment.

FIG. 8 is a cross-sectional view illustrating an example of the blanking aperture stage mechanism of the first embodiment. In FIG. 8, a rotary stage 62 is disposed on a stationary stage 64 in the blanking aperture stage mechanism 212. The rotary stage 62 is disposed on the stationary stage 64 with a ball bearing 66 interposed therebetween so as to be made rotatable. Further, the blanking aperture array mechanism 204 is placed on the rotary stage 62 with a cooling block 60 interposed therebetween. Accordingly, a structure, which includes the rotary stage 62 and the cooling block 60, functions as a movable stage disposed in a vacuum atmosphere and mounting a heat source. The stationary stage 64 is disposed so as to be put in the electron optical column 102. A water-cooled block 68 is disposed under the stationary stage 64. The central portion of each of the stationary stage 64, the rotary stage 62, the cooling block 60, and the water-cooled block 68 is opened to be larger than a passage region 17 for multiple beams 20 so that the multiple beams 20 can pass through the stationary stage 64, the rotary stage 62, the cooling block 60, and the water-cooled block 68. A cavity is formed in the stationary stage 64, and an exhaust port 63 is formed in the stationary stage 64 in a predetermined direction on a plane orthogonal to the optical axis 15. Heat pipes 50 are disposed so as to be exposed to the upper surface of the cooling block 60. For example, a wick-type member, which is made of a copper material as a low thermal resistance material and is formed in the form of a pipe, is used as the heat pipe 50. Since the heat pipes are used, heat can be transported more efficiently than the heat conduction of a lump of metal. Further, a sufficient cross-sectional area is also employed as the cross-sectional area of the heat pipe 50 so that heat to be allowed can be exhausted. For example, a copper pipe having a diameter of 10 mm is used. The heat pipes 50, which are exposed to the upper surface of the cooling block 60, are machined so as to be flush with the upper surface of the cooling block 60. The heat pipes 50 extend from the upper surface of the cooling block 60 to the bottom (back) of the rotary stage 62 through the inside of the cooling block 60, and are exposed to the bottom of the rotary stage 62. The heat pipes 50, which are exposed to the bottom of the rotary stage 62, are machined so as to be flush with the bottom of the rotary stage 62.

Meanwhile, heat pipes 52 are also disposed so as to be exposed to the upper surface of the stationary stage 64 at positions corresponding to the positions of the heat pipes 50 that are exposed to the bottom of the rotary stage 62. In other words, a divided cross-section that divides apart of each heat pipe 50 (first heat pipe) in a semicircular shape and a divided cross-section that divides a part of each heat pipe 52 (second heat pipe) in a semicircular shape are disposed so as to face each other. Accordingly, heat exchange is performed between portions (the divided cross-sections) of the heat pipes 50 that are exposed to the bottom of the rotary stage 62 and portions (the divided cross-sections) of the heat pipe 52 that are exposed to the upper surface of the stationary stage 64. Meanwhile, since the rotary stage 62 is moved in a rotation direction, the portions of the heat pipes 50 exposed to the bottom of the rotary stage 62 and the portions of the heat pipes 52 exposed to the upper surface of the stationary stage 64 form a movable mechanism 57. In other words, the movable mechanism 57 is movable according to the movement of the heat pipes 50, which is caused by the movement of the stage, by using a part of the heat pipes 50 and 52. It is suitable that the heat pipe 52 is made of, for example, the same material as the heat pipe 50. The heat pipes 52, which are exposed to the upper surface of the stationary stage 64, are machined so as to be flush with the upper surface of the stationary stage 64. The heat pipes 52 extend from the upper surface of the stationary stage 64 to the bottom (back) of the stationary stage 64 through the inside of the stationary stage 64, and are disposed so as to be embedded in the water-cooled block 68 that is disposed under the stationary stage 64. A cooling pipe 54 is laid in the water-cooled block 68, and constant-temperature water flows in the cooling pipe 54. The water-cooled block 68 (cooling mechanism) cools the heat pipes 50 through the heat pipes 52 and the movable mechanism 57. In other words, the heat pipes 52, the water-cooled block 68, and the like form a cooling mechanism, and the cooling mechanism cools the heat pipes 50 through the movable mechanism 57.

Figure 9A:
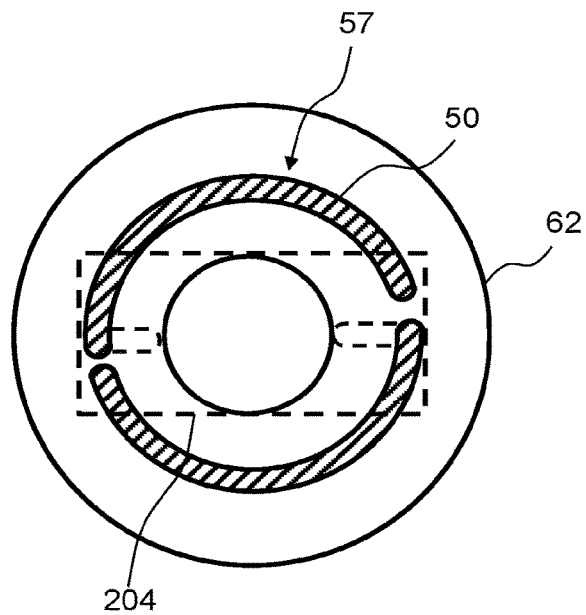
FIGS. 9A and 9B are diagrams illustrating the structure of the back surface of a rotary stage and the structure of the upper surface of a stationary stage of the blanking aperture stage mechanism of the first embodiment.
Figure 9B:
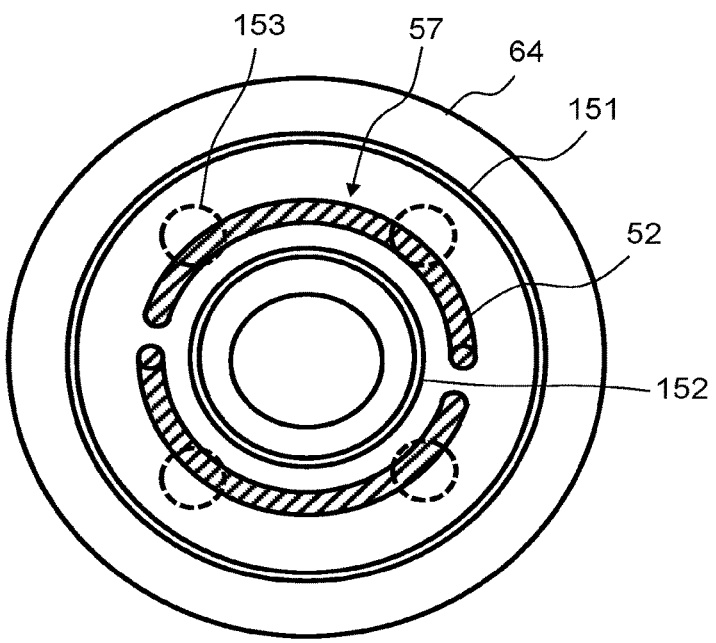

FIGS. 9A and 9B are diagrams illustrating the structure of the back surface of the rotary stage and the structure of the upper surface of the stationary stage of the blanking aperture stage mechanism of the first embodiment. FIG. 9A illustrates a state in which the bottom of the rotary stage 62 is seen from below. FIG. 9B illustrates a state in which the upper surface of the stationary stage 64 is seen from the top. A case in which two transmission circuits 13 are disposed on the back side of the blanking aperture array mechanism 204 is described in the example of FIGS. 8 and 9A. Accordingly, when the blanking aperture array mechanism 204 is placed on the cooling block 60, the two transmission circuits 13 are in contact with the cooling block 60. Therefore, the transfer of heat from the blanking aperture array mechanism 204 as a heat source is performed through the two transmission circuits 13. In the first embodiment, one heat pipe 50 is disposed at a position that is in contact with one transmission circuit of the two transmission circuits 13, and the other heat pipe 50 is disposed at a position that is in contact with the other transmission circuit of the two transmission circuits 13. In other words, the heat pipes 50 are connected to the heat source. Accordingly, the heat pipes 50 can directly absorb heat from the heat source. Therefore, it is suitable that the portion of each heat pipe 50, which is exposed to the upper surface of the cooling block 60, is formed to extend toward the center (the optical axis 15) as illustrated in FIG. 9A so that the contact surface of the portion of each heat pipe 50 being in contact with the transmission circuit 13 is large. Further, two heat pipes 52 are disposed so as to correspond to the two heat pipes 50 as illustrated in FIGS. 8 and 9B.

As illustrated in FIG. 9A, the portions (exposed portions) of the heat pipes 50, which configure (or "form") portions of the movable mechanism 57, are laid along the movable direction (rotation direction, or "circumference direction") of the rotary stage 62. Likewise, as illustrated in FIG. 9B, the portions (exposed portions) of the heat pipes 52, which configure (form) portions of the movable mechanism 57, are laid along the movable direction (rotation direction, or "circumference direction") of the rotary stage 62. Accordingly, since the heat pipes 50 and 52 overlap each other even though the rotary stage 62 is moved in the rotation direction, heat exchange can be continued. Meanwhile, it is suitable that each of two heat pipes 50 is formed so as to be laid along the half of the circumference in the movable direction in the example of FIG. 9A. Likewise, it is suitable that each of two heat pipes 52 is also formed so as to be laid along the half of the circumference in the movable direction in the example of FIG. 9B. Since each of two heat pipes is formed so as to be laid along the half of the circumference, a heat exchange load, which is more excessive than the heat exchange load of the other kind of heat pipe, is not applied to one kind of heat pipe of two kinds of heat pipes 50 (52). As a result, the efficiency of heat exchange can be improved.

Further, in the first embodiment, a grease material 61 is disposed between an end face on the heat pipe 50 side of the movable mechanism 57 and an end face on the heat pipe 52 side, being corresponding to the water-cooled block 68 (cooling mechanism) side, of the movable mechanism 57. Accordingly, the heat pipes 50 and 52 can be made to be in contact with each other with the grease material 61 interposed therebetween. Therefore, the efficiency of heat exchange can be improved. Furthermore, the sliding between the heat pipes 50 and 52 is suppressed, so that the movability of the movable mechanism 57 can be achieved. It is suitable that a material containing fine particles of carbon (C) is used as the grease material 61. Since the grease material 61 contains fine particles of carbon (C), thermal resistance can be reduced. Further, it is suitable that a material having low saturated vapor pressure is used as the grease material 61. Particularly, it is more suitable that a material having saturated vapor pressure lower than pressure in the electron optical column 102 0.1 times or less is used as the grease material 61. For example, FOMBLIN (registered trademark) is suitable. Meanwhile, a gap between both the end faces of the movable mechanism 57 may be set according to the thermal conductivity of the grease material 61. Specifically, the gap between both the end faces of the movable mechanism 57 is set so that the gap between both the end faces of the movable mechanism 57 is filled with the grease material 61 having a thickness where the thermal resistance of the grease material 61 is lower than, for example, 0.9 K/W. When the thermal conductivity of the grease material 61 is, for example, 0.1 W/(m·K), the gap between both the end faces of the movable mechanism 57 may be set to be narrower than 900 µm. Here, in order to sufficiently reduce thermal resistance, it is suitable that the gap between both the end faces of the movable mechanism 57 is set to 100 µm or less. In other words, it is more suitable that the thickness of the grease material 61 is set to 100 µm or less.

As illustrated in FIG. 8, a differential exhaust mechanism, which exhausts gas generated from the grease material 61 to reduce leak of the gas to the vacuum atmosphere, is further provided in the first embodiment. Specifically, an annular opening 151 is formed on the upper surface of the stationary stage 64 outside the movable mechanism 57 and an annular opening 152 is formed on the upper surface of the stationary stage 64 inside the movable mechanism 57. Meanwhile, a part of the upper surface of the stationary stage 64, which is cut out by the openings 151 and 152, may be supported by support posts 153 as illustrated in FIG. 9B. Further, vacuuming is performed through the exhaust port 63 by a vacuum pump (not illustrated) so that pressure in the stationary stage 64 is lower than pressure in the electron optical column 102. Furthermore, the opening areas of the openings 151 and 152 are set to be sufficiently large so that the conductance C2 of an exhaust path formed from the grease material 61 through the opening is sufficiently larger than the conductance C1 of a leak path formed from the grease material through a gap between the stationary stage 64 and the rotary stage 62. Accordingly, gas generated from the grease material 61 can be made to mainly flow not in the electron optical column 102 but in the exhaust port 63.

Accordingly, according to the blanking aperture stage mechanism 212 of the first embodiment, a heat source disposed in vacuum can be movably placed and heat generated from the heat source can be exhausted.

Figure 10:
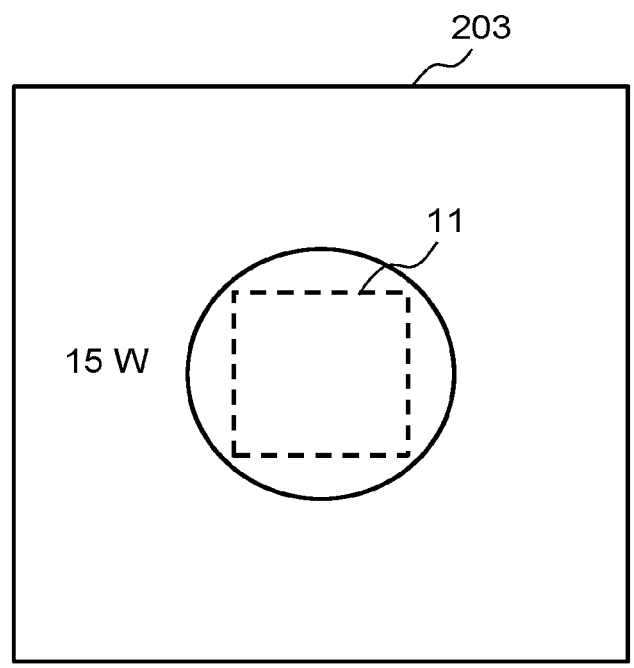
FIG. 10 is a diagram illustrating an example of the amount of generated heat of the shaping aperture array substrate of the first embodiment.

FIG. 10 is a diagram illustrating an example of the amount of generated heat of the shaping aperture array substrate of the first embodiment. The rectangular region 11 of the shaping aperture array substrate 203, in which the plurality of holes 22 are formed, is irradiated with the electron beam 200. Further, most of the electron beam 200 is blocked by the shaping aperture array substrate 203. The shaping aperture array substrate 203 generates heat due to the collision of the electron beam 200. Heat of, for example, 15 W is generated. Accordingly, the shaping aperture array substrate 203 also serves as a heat source.

Figure 11:
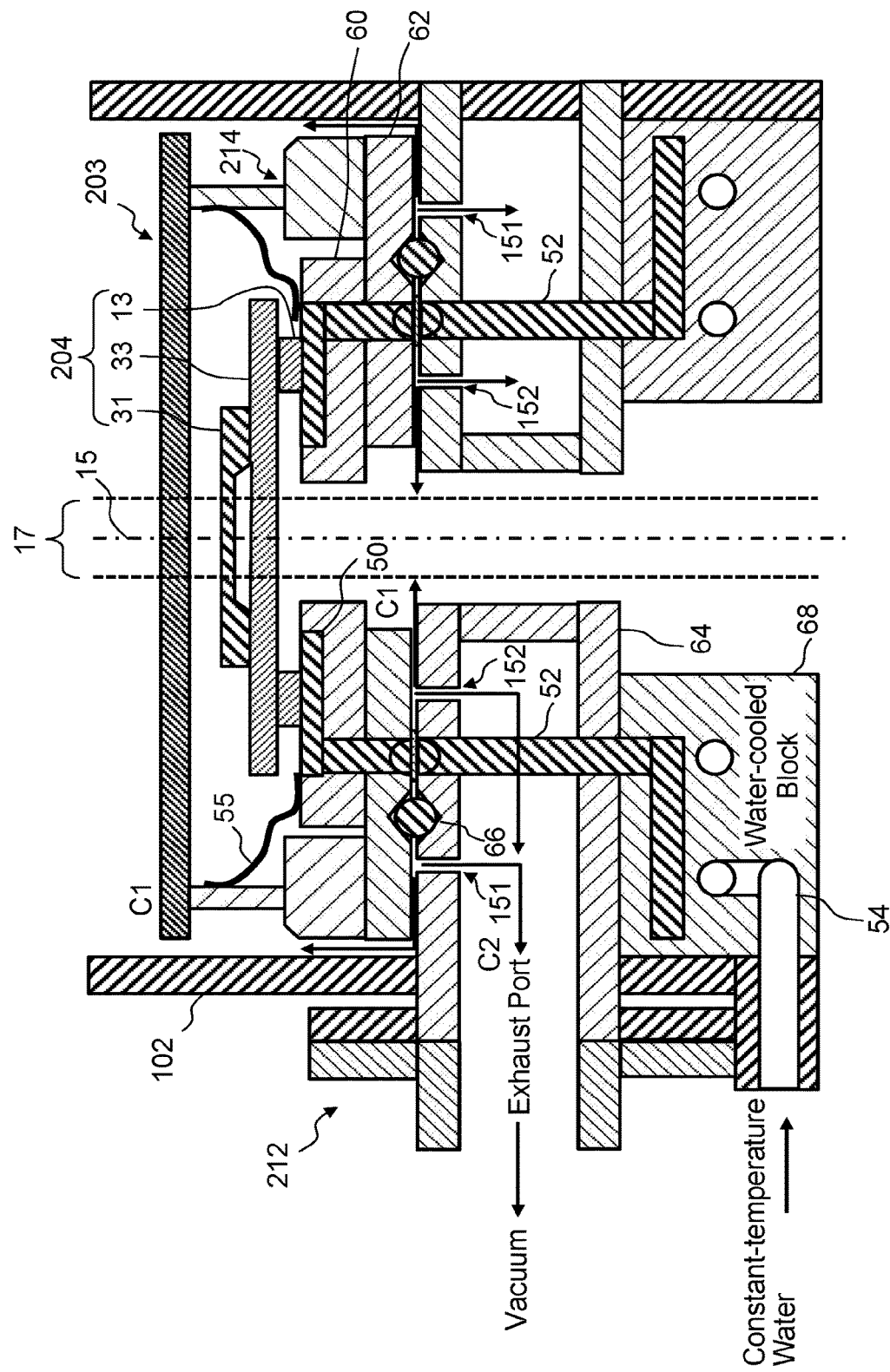
FIG. 11 is a cross-sectional view illustrating another example of the blanking aperture stage mechanism of the first embodiment.

FIG. 11 is a cross-sectional view illustrating another example of the blanking aperture stage mechanism of the first embodiment. In FIG. 11, a shaping aperture stage 214 is further disposed on the blanking aperture stage mechanism 212 and a shaping aperture array substrate 203 is placed on the shaping aperture stage 214. Since the blanking aperture stage mechanism 212 performs the rough adjustment of the positions of the plurality of passage holes 25 of the blanking aperture array mechanism 204 and the position of the X-Y stage 105 in the rotation direction, the moving distance of the blanking aperture stage mechanism 212 is relatively long. In contrast, the shaping aperture stage 214 performs fine adjustment for making the positions of the plurality of holes 22 of the shaping aperture array substrate 203 correspond to the positions of the plurality of passage holes 25 of the blanking aperture array mechanism 204 having been roughly adjusted. For this purpose, the shaping aperture stage 214 is adapted to be movable in an x direction, a y direction, and a θ direction by a drive mechanism (not illustrated). As described above, the shaping aperture array substrate 203 also serves as a heat source. Accordingly, heat generated from the shaping aperture array substrate 203 also needs to be exhausted. Therefore, in the example of FIG. 11, portions of the shaping aperture stage 214 close to the shaping aperture array substrate 203 are connected to the cooling block 60 by copper wires 55. For the suppression of a temperature rise within, for example, 40K with the generated heat of, for example, 15 W, thermal resistance may be set to about 2.7 K/W or less. Accordingly, thermal resistance can be increased in comparison with a case in which heat generated in the blanking aperture array mechanism 204 is exhausted. In addition, since the moving distance of the shaping aperture stage 214 is a moving distance for fine adjustment, the moving distance of the shaping aperture stage 214 is sufficiently shorter than the moving distance of the rotary stage 62 of the blanking aperture stage mechanism 212. Accordingly, the thickness of a wire can be made to be sufficiently larger than the thickness of a wire that can be used for the moving distance of the rotary stage 62 of the blanking aperture stage mechanism 212. Therefore, even when the shaping aperture stage 214 is connected to the cooling block 60 by the copper wires 55, it is also possible to sufficiently cope with the movement of the shaping aperture stage 214 while maintaining the sufficient transfer of heat. Since heat is exhausted by the heat pipes 50 in the first embodiment, heat generated in the shaping aperture array substrate 203 can also be collectively exhausted even though the shaping aperture stage 214 is disposed on the blanking aperture stage mechanism 212.

Figure 12:
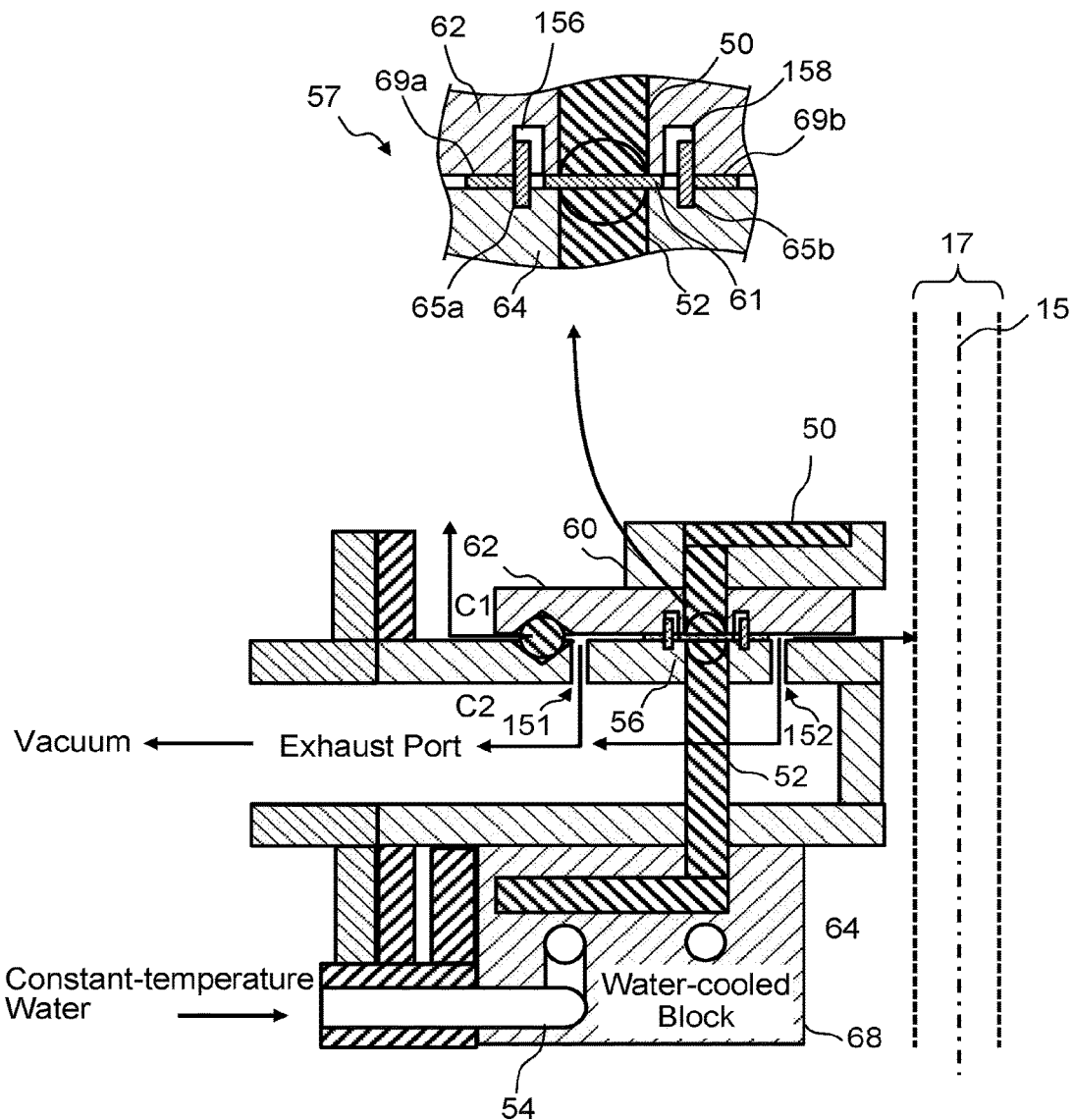
FIG. 12 is a cross-sectional view illustrating a modification of the blanking aperture stage mechanism of the first embodiment.

FIG. 12 is a cross-sectional view illustrating a modification of the blanking aperture stage mechanism of the first embodiment. The cross-section of one side of the optical axis 15 is not illustrated in FIG. 12. In the modification illustrated in FIG. 12, seal mechanisms are disposed on the outside and the inside of the movable mechanism 57. Specifically, grooves are formed on the upper surface of the stationary stage 64 on the outside and the inside of the movable mechanism 57. Then, a ring 65a is disposed in the groove that is formed on the upper surface of the stationary stage 64 on the outside of the movable mechanism 57. A ring 65b is disposed in the groove that is formed on the upper surface of the stationary stage 64 on the inside of the movable mechanism 57. All of the rings 65a and 65b are disposed so as to protrude upward more than the gap between the stationary stage 64 and the rotary stage 62. Further, a groove 156 is also formed on the back surface of the rotary stage 62 at a position corresponding to the groove that is formed on the upper surface of the stationary stage 64 on the outside of the movable mechanism 57. A groove 158 is formed at a position corresponding to the groove that is formed on the upper surface of the stationary stage 64 on the inside of the movable mechanism 57. Meanwhile, it is suitable that the widths of the grooves 156 and 158 are larger than the widths of the grooves formed on the stationary stage 64 so that the grooves can be aligned with each other. According to such a structure, the ring 65a serves as a wall and can prevent the grease material 61 of the movable mechanism 57 from leaking to the outer peripheral side. Likewise, the ring 65b serves as a wall and can prevent the grease material 61 of the movable mechanism 57 from leaking to the inner peripheral side. In addition, grease 69a is disposed in a gap portion, which is positioned on the outer peripheral side of the ring 65a, of the gap between the stationary stage 64 and the rotary stage 62. Likewise, grease 69b is disposed in a gap portion, which is positioned on the inner peripheral side of the ring 65b, of the gap between the stationary stage 64 and the rotary stage 62. The same material as the grease material 61 is used as the grease 69a and 69b. However, a material not containing fine particles of carbon is used as the grease. According to such a structure, the grease 69a and 69b serves as a seal material and can prevent the fine particles of carbon of the grease material 61 from leaking from the gap between the rings 65a and 65b.

Meanwhile, it goes without saying that all of the grease 69a and 69b are provided between the openings 151 and 152 of the differential exhaust mechanism. Accordingly, the leakage of gas, which is generated from the grease 69a and 69b, into the electron optical column 102 can be prevented.

As described above, according to the first embodiment, the shaping aperture array substrate 203 and the blanking aperture array mechanism 204, which are disposed in vacuum and serve as heat sources, can be movably placed and heat generated from the heat sources can be collectively exhausted.

Second Embodiment

A case in which the movable mechanism 57 of the blanking aperture stage mechanism 212 is disposed in a space not isolated from the same vacuum atmosphere through which the multiple beams 20 pass has been described in the first embodiment. However, a space in which the movable mechanism is disposed is not limited to such a case. A case in which the movable mechanism 57 of the blanking aperture stage mechanism 212 is disposed in a space isolated from the same vacuum atmosphere through which the multiple beams 20 pass will be described in a second embodiment. Contents other than contents, which will be particularly described below, are the same as the contents described in the first embodiment.

Figure 13:
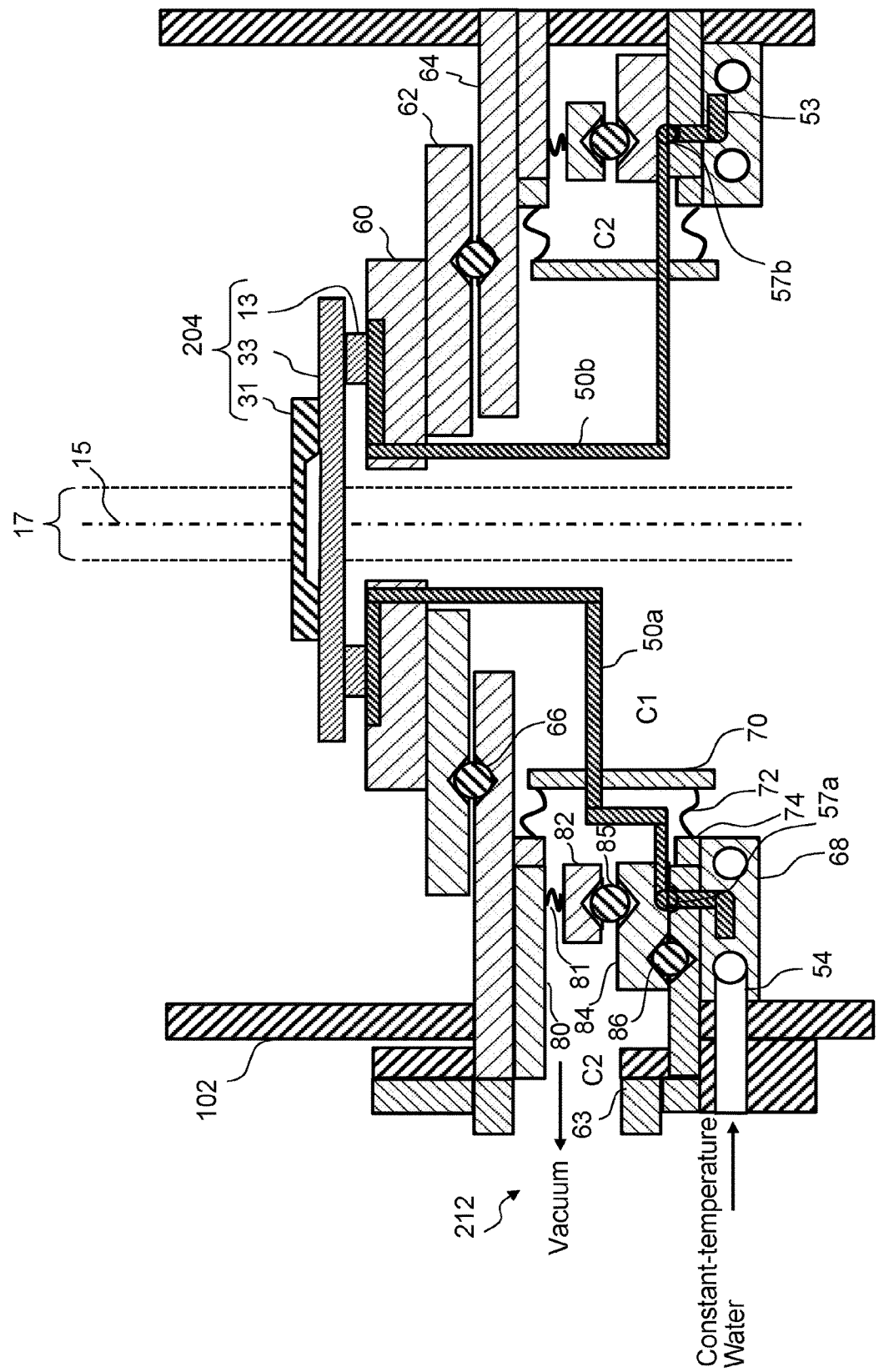
FIG. 13 is a cross-sectional view illustrating an example of a blanking aperture stage mechanism of a second embodiment.

FIG. 13 is a cross-sectional view illustrating an example of a blanking aperture stage mechanism of the second embodiment. In FIG. 13, a rotary stage 62 is disposed on a stationary stage 64 in a blanking aperture stage mechanism 212 of the second embodiment. The rotary stage 62 is disposed on the stationary stage 64 with a ball bearing 66 interposed therebetween so as to be made rotatable. Further, a blanking aperture array mechanism 204 is placed on the rotary stage 62 with a cooling block 60 interposed therebetween. Accordingly, a structure, which includes the rotary stage 62 and the cooling block 60, functions as a movable stage disposed in a vacuum atmosphere and mounting a heat source. The stationary stage 64 is disposed so as to be put in an electron optical column 102. A water-cooled block 68 is disposed under the stationary stage 64. The central portion of each of the stationary stage 64, the rotary stage 62, the cooling block 60, and the water-cooled block 68 is opened to be larger than a passage region 17 for multiple beams 20 so that the multiple beams 20 can pass through the stationary stage 64, the rotary stage 62, the cooling block 60, and the water-cooled block 68. A cavity is formed in the stationary stage 64, and an exhaust port 63 is formed in the stationary stage 64 in a predetermined direction on a plane orthogonal to an optical axis 15.

Here, in the stationary stage 64 of the second embodiment, movable partition walls 70, which isolate the vacuum atmosphere of the passage region 17 for multiple beams 20, are disposed close to the passage region 17 for multiple beams 20. In the example of FIG. 13, two movable partition walls 70 are disposed at positions that face each other with the passage region 17 interposed therebetween. The surfaces, which form wall surfaces, of the movable partition walls 70 are connected to the stationary stage 64 by pipes, which have movability against expansion/contraction and bending, such as bellows pipes 72. Further, the bellows pipes 72 are connected to flanges 74 so that gaps are not formed at welding portions. Then, the flanges 74 are fixed to the side of the stationary stage 64 facing the passage region 17 for multiple beams 20. In the example of FIG. 13, a stationary stage body 80, which is disposed on the back surface of an upper surface portion of the stationary stage 64, is connected to the flanges 74.

Heat pipes 50 are disposed so as to be exposed to the upper surface of the cooling block 60. For example, a copper material, which is a low thermal resistance material, is used as the material of a pipe portion of the heat pipe 50. Further, a sufficient cross-sectional area is also employed as the cross-sectional area of the heat pipe 50 so that heat to be allowed can be exhausted. For example, a copper pipe having a diameter of 10 mm is used. The heat pipes 50, which are exposed to the upper surface of the cooling block 60, are machined so as to be flush with the upper surface of the cooling block 60. The heat pipes 50 pass through the inside of the cooling block 60 from the upper surface of the cooling block 60, and are exposed to the vacuum atmosphere of the passage region 17 for multiple beams 20 once. Then, the heat pipes 50, which are exposed to the vacuum atmosphere of the passage region 17 for multiple beams 20, are bent, for example, in a direction orthogonal to the optical axis 15 and pass through the movable partition walls 70. The movable partition walls 70 are machined so that gaps allowing atmospheres, which are present on both sides of the movable partition wall 70, to communicate with each other are not formed when the heat pipe 50 passes through the movable partition wall 70.

The heat pipes 50, which pass through the movable partition walls 70 and extend to the outside of the movable partition walls 70, pass through a movable block 84, which is formed, for example, in an annular shape, and are exposed to the bottom of the movable block 84. The heat pipes 50, which are exposed to the bottom of the movable block 84, are machined so as to be flush with the bottom of the movable block 84.

Meanwhile, the heat pipes 53 are also disposed so as to be exposed to the bottom (the upper surface of a bottom portion) of a cavity, which is formed in the stationary stage body 80, at positions corresponding to the positions of the heat pipes 50 that are exposed to the bottom of the movable block 84. Accordingly, heat exchange is performed between portions of the heat pipes 50 that are exposed to the bottom of the movable block 84 and portions of the heat pipes 53 that are exposed to the bottom of the cavity formed in the stationary stage body 80.

Meanwhile, since the rotary stage 62 is moved in the rotation direction relative to the optical axis 15, the heat pipes 50 are also moved in the rotation direction relative to the optical axis 15 likewise. Accordingly, the movable block 84 is also in the rotation direction relative to the optical axis 15 likewise. Therefore, the portions of the heat pipes 50 exposed to the bottom of the movable block 84 and the portions of the heat pipes 53 exposed to the bottom of the cavity formed in the stationary stage body 80 form a movable mechanism 57. In other words, the movable mechanism 57 is disposed in the separate atmosphere that is isolated from the vacuum atmosphere of the passage region 17 for multiple beams 20 by the movable partition walls 70. Further, the movable mechanism 57 is movable according to the movement of the heat pipes 50, which is caused by the movement of the stage, by using a part of the heat pipes 50 and 53.

It is suitable that the heat pipe 53 is made of, for example, the same material as the heat pipe 50. The heat pipes 53, which are exposed to the bottom of the cavity formed in the stationary stage body 80, are machined so as to be flush with the bottom of the cavity formed in the stationary stage body 80. The heat pipes 53 extend from the bottom of the cavity, which is formed in the stationary stage body 80, through the bottom portion of the stationary stage body 80, and are disposed so as to be embedded in the water-cooled block 68 that is disposed under the stationary stage 64. A cooling pipe 54 is laid in the water-cooled block 68, and constant-temperature water flows in the cooling pipe 54. The water-cooled block 68 (cooling mechanism) cools the heat pipes 50 through the heat pipes 53 and the movable mechanism 57. In addition, in other words, the heat pipes 53, the water-cooled block 68, and the like form a cooling mechanism, and the cooling mechanism cools the heat pipes 50 through the movable mechanism 57.

Meanwhile, the movable block 84 is disposed on the bottom of the cavity, which is formed in the stationary stage body 80, with a ball bearing 86 interposed therebetween so as to be made movable (rotatable). Further, a pressing block 82, which is formed, for example, in an annular shape, is disposed in the cavity formed in the stationary stage body 80, and a force acts on the pressing block 82 downward by the elastic force of a spring 81 that is disposed on the upper surface of the cavity formed in the stationary stage body 80. Further, the upper surface of the movable block 84 is pressed downward by the pressing block 82 with a ball bearing 85 interposed therebetween. The movable block 84 is adapted not to float by such a pressing force.

Even in the second embodiment, two transmission circuits 13 of the blanking aperture array mechanism 204 are in contact with the cooling block 60 as in the first embodiment. Accordingly, the transfer of heat from the blanking aperture array mechanism 204 as a heat source is performed through the two transmission circuits 13. In the second embodiment, one heat pipe 50 is disposed at a position that is in contact with one transmission circuit of the two transmission circuits 13, and the other heat pipe 50 is disposed at a position that is in contact with the other transmission circuit of the two transmission circuits 13. Further, it is suitable that the portion of each heat pipe 50, which is exposed to the upper surface of the cooling block 60, is formed to extend toward the center (the optical axis 15) as in the first embodiment so that the contact surface of the portion of each heat pipe 50 being in contact with the transmission circuit 13 is large. Furthermore, two heat pipes 53 are disposed so as to correspond to the two heat pipes 50 as illustrated in FIG. 13.

Further, the portions (exposed portions) of the heat pipes 50, which form portions of the movable mechanism 57, are laid along the movable direction (rotation direction, or "circumference direction") of the movable block 84 (the rotary stage 62). Likewise, the portions (exposed portions) of the heat pipes 53, which form portions of the movable mechanism 57, are laid along the movable direction (rotation direction, or "circumference direction") of the movable block 84 (the rotary stage 62). Accordingly, since the heat pipes 50 and 53 overlap each other even though the movable block 84 is dragged and moved by the heat pipes 50 moving with the movement of the rotary stage 62 in the rotation direction, heat exchange can be continued. Meanwhile, it is suitable that each of two heat pipes 50 is formed so as to be laid along the half of the circumference in the movable direction as in the first embodiment. Likewise, it is suitable that each of two heat pipes 53 is formed so as to be laid along the half of the circumference in the movable direction. Since each of two heat pipes is formed so as to be laid along the half of the circumference, a heat exchange load, which is more excessive than the heat exchange load of the other kind of heat pipe, is not applied to one kind of heat pipe of two kinds of heat pipes 50 (53). As a result, the efficiency of heat exchange can be improved.

Furthermore, as in the first embodiment, the same grease material 61 as the grease material 61 of the first embodiment is disposed between an end face on the heat pipe 50 side of the movable mechanism 57 and an end face on the heat pipe 53 side, being the water-cooled block 68 (cooling mechanism) side, of the movable mechanism 57. Accordingly, the heat pipes 50 and 53 can be made to be in contact with each other with the grease material 61 interposed therebetween. Therefore, the efficiency of heat exchange can be improved. In the second embodiment, the movable mechanism 57 is not disposed in the vacuum atmosphere of the passage region 17 for multiple beams 20. Accordingly, since the atmosphere is isolated by the movable partition walls 70 even though gas or particles of carbon leak to the periphery from the grease material 61 as the movable mechanism 57 is movable, the gas or the particles of carbon do not leak to the vacuum atmosphere of the passage region 17 for multiple beams 20. Accordingly, gas present outside the movable partition walls 70 (gas present in the cavity formed in the stationary stage 64) may not be exhausted. However, the invention is not limited thereto, and the atmosphere outside the movable partition walls 70 (the atmosphere present in the cavity formed in the stationary stage 64) may be exhausted through the exhaust port 63 so that pressure C2 in the stationary stage 64 is lower than pressure C1 in the electron optical column 102. Accordingly, even when the movable partition walls 70, movable pipes (bellows pipes 72), or the like are cracked and vacuum is broken, the leakage of gas or particles of carbon to the passage region 17 for multiple beams 20 from the grease material 61 can be prevented immediately.

Accordingly, according to the blanking aperture stage mechanism 212 of the second embodiment, a heat source disposed in vacuum can be movably placed and heat generated from the heat source can be exhausted.

Figure 14:
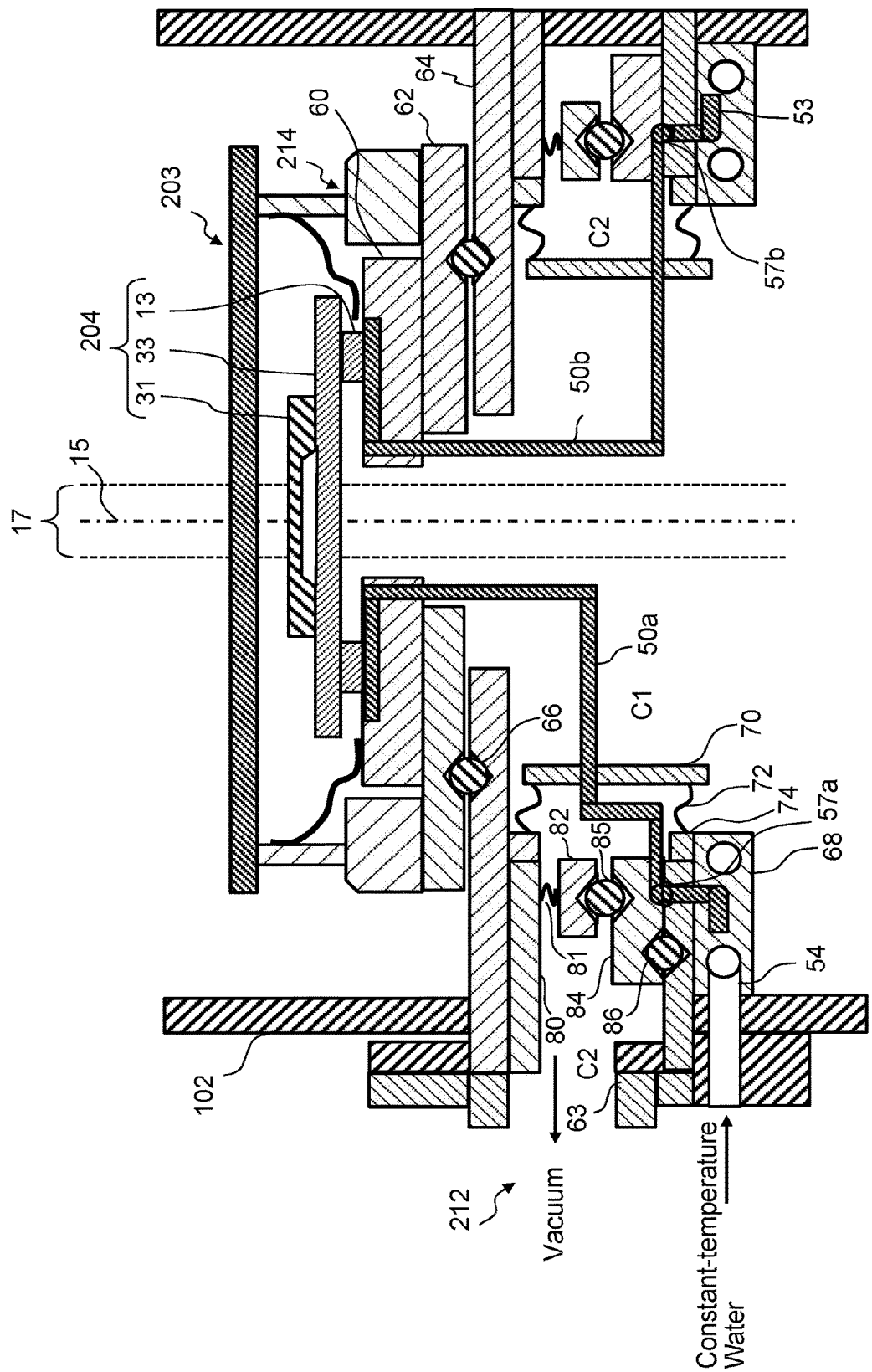
FIG. 14 is a cross-sectional view illustrating another example of a blanking aperture stage mechanism of the second embodiment.

FIG. 14 is a cross-sectional view illustrating another example of the blanking aperture stage mechanism of the second embodiment. In FIG. 14, a shaping aperture stage 214 is further disposed on the blanking aperture stage mechanism 212 and a shaping aperture array substrate 203 is placed on the shaping aperture stage 214. A layout method and a method of exhausting heat from the shaping aperture stage 214 are the same as those of FIG. 11. Accordingly, since heat is exhausted by the heat pipes 50 as in the first embodiment, in the second embodiment, heat generated in the shaping aperture array substrate 203 can also be collectively exhausted even though the shaping aperture stage 214 is disposed on the blanking aperture stage mechanism 212.

As described above, according to the second embodiment, the shaping aperture array substrate 203 and the blanking aperture array mechanism 204, which are disposed in vacuum and serve as heat sources, can be movably placed and heat generated from the heat sources can be collectively exhausted.

Embodiments have been described above with reference to specific examples. However, the invention is not limited to these specific examples. The heat pipes 52 (53) have been embedded in the water-cooled block 68 on the downstream side of the movable mechanism 57 (57) in the above-mentioned examples, but the invention is not limited thereto. The heat pipes 52 (53) may not be disposed so as to extend into the water-cooled block 68 if thermal resistance can be reduced.

Further, the pipe paths of the two heat pipes 50 (52) (53) may be symmetric with respect to the optical axis as illustrated in FIG. 8 and the like, and may not be symmetric with respect to the optical axis as illustrated in FIG. 13 and the like. Meanwhile, an example of each of the pipe paths of the above-mentioned heat pipes 50 (52) (53) has been illustrated in the drawings, and the thicknesses (widths) of the heat pipes 50 (52) (53) are not particularly exactly illustrated.

Furthermore, the description of portions, which are not directly required for the description of the invention, such as the structures of the apparatus and a control method, has been omitted, but the structures of the apparatus, a control method, and the like to be required can be appropriately selected and used. For example, the description of the structure of a control unit, which controls the lithography apparatus 100, has been omitted, but it goes without saying that the structure of a control unit to be required are appropriately selected and used.

All of apparatuses for blanking multiple-charged particle beams, and, methods of blanking multiple-charged particle beams, and multiple-charged particle beam lithography apparatuses, which include the component of the invention and are appropriately changed in design by those skilled in the art, are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stage mechanism comprising:
a movable stage disposed in a vacuum atmosphere and mounting a heat source;
a first heat pipe connected to the heat source;
a movable mechanism configured to move according to the movement of the first heat pipe caused by the movement of the stage, by using a portion of the first heat pipe; and
a cooling mechanism configured to cool the first heat pipe through the movable mechanism,
wherein a blanking aperture array mechanism individually performing blanking deflection of multiple beams using a charged particle beam is used as the heat source.

2. The stage mechanism according to claim 1, further comprising:
a grease material disposed between an end face on the first heat pipe side of the movable mechanism and an end face on the cooling mechanism side of the movable mechanism.

3. The stage mechanism according to claim 2, further comprising:
a differential exhaust mechanism configured to exhaust gas generated from the grease material to reduce leak of the gas to the vacuum atmosphere.

4. The stage mechanism according to claim 1,
wherein the portion of the first heat pipe configuring a portion of the movable mechanism is laid along a movable direction.

5. The stage mechanism according to claim 1, further comprising:
a movable partition wall where the first heat pipe passes and isolating the vacuum atmosphere,
wherein the movable mechanism is disposed in separate atmosphere isolated from the vacuum atmosphere by the movable partition wall.

6. The stage mechanism according to claim 1,
wherein the first heat pipe is disposed close to the heat source from the movable mechanism,
the stage mechanism further comprising:
a second heat pipe, a part of the second heat pipe being used in the movable mechanism and being disposed close to the cooling mechanism from the movable mechanism,
the cooling mechanism cools the first heat pipe through the second heat pipe.

7. The stage mechanism according to claim 6, further comprising:
a grease material disposed between an end face on the first heat pipe side of the movable mechanism and an end face on the second heat pipe side, being the cooling mechanism side, of the movable mechanism.

8. The stage mechanism according to claim 6,
wherein, in the movable mechanism, a divided cross-section dividing a part of the first heat pipe in a semicircular shape is disposed to face a divided cross-section dividing a part of the second heat pipe in a semicircular shape.

9. The stage mechanism according to claim 6,
wherein portions of the first and second heat pipes forming portions of the movable mechanism are laid along a circumference direction.

* * * * *